United States Patent [19]

Utsumi et al.

[11] Patent Number: 4,766,671
[45] Date of Patent: Aug. 30, 1988

[54] METHOD OF MANUFACTURING CERAMIC ELECTRONIC DEVICE

[75] Inventors: Kazuaki Utsumi; Hideo Takamizawa; Mitsuo Tsuzuki; Michihisa Suga; Sadayuki Takahashi, all of Tokyo, Japan

[73] Assignee: NEC Corporation, Japan

[21] Appl. No.: 923,105

[22] Filed: Oct. 24, 1986

[30] Foreign Application Priority Data

| Oct. 29, 1985 | [JP] | Japan | 60-243218 |
| Oct. 29, 1985 | [JP] | Japan | 60-243219 |
| Oct. 29, 1985 | [JP] | Japan | 60-243220 |
| Dec. 4, 1985 | [JP] | Japan | 60-273942 |
| Dec. 4, 1985 | [JP] | Japan | 60-273943 |
| Dec. 9, 1985 | [JP] | Japan | 60-277243 |
| Apr. 11, 1986 | [JP] | Japan | 61-83656 |
| Apr. 11, 1986 | [JP] | Japan | 61-83657 |
| Jun. 25, 1986 | [JP] | Japan | 61-150383 |

[51] Int. Cl.[4] .............................................. H01K 3/22
[52] U.S. Cl. ................................. 29/848; 29/611; 156/89; 174/68.5; 427/97
[58] Field of Search ................ 29/851, 840, 830, 611, 29/846, 848; 427/97, 96; 156/89; 174/68.5; 264/61; 428/901

[56] References Cited

U.S. PATENT DOCUMENTS

| 3,948,706 | 4/1976 | Schmeckenbecher | 156/89 |
| 4,137,628 | 2/1979 | Suzuki | 156/89 |
| 4,345,955 | 8/1982 | Bakermans et al. | 156/89 |
| 4,490,429 | 12/1984 | Tosaki et al. | 427/97 X |
| 4,510,000 | 4/1985 | Kumar et al. | 29/851 X |
| 4,620,264 | 10/1986 | Ushifusa et al. | 174/68.5 X |
| 4,641,425 | 2/1987 | Dubuisson et al. | 29/851 X |
| 4,654,095 | 3/1987 | Steinberg | 156/89 |
| 4,680,859 | 7/1987 | Johnson | 29/611 |

OTHER PUBLICATIONS

IEEE Transaction on Parts, Hybrids and Packaging, vol. PHP-9, No. 3, Sep. 1983.

Primary Examiner—Timothy V. Eley
Assistant Examiner—Carl J. Arbes
Attorney, Agent, or Firm—Laff, Whitesel, Conte & Saret

[57] ABSTRACT

A method of manufacturing a ceramic electronic device includes the steps of: forming a pattern of a predetermined shape made of a photosensitive resin; forming an electrical circuit element on a ceramic green sheet; stacking and pressing the pattern, the ceramic green sheet having the electrical circuit element thereon, and at least one ceramic green sheet to prepare a laminated body; and sintering the laminated body. A ceramic electronic device integrally including a cavity and the electrical circuit element therein is manufactured by this method.

9 Claims, 17 Drawing Sheets

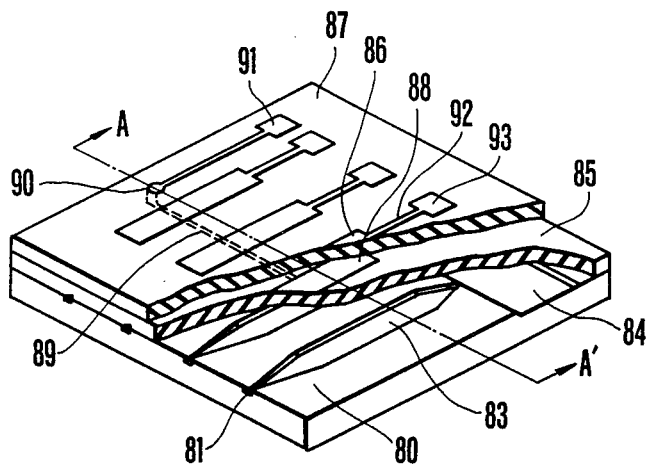
F I G.12(a)
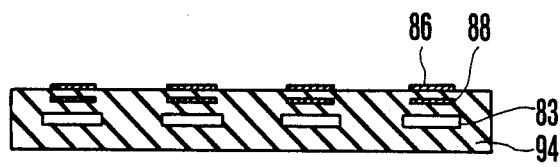
F I G.12(b)

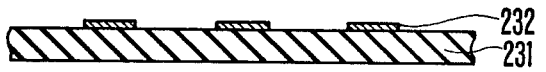

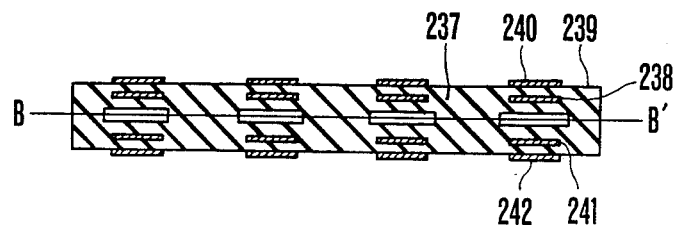
F I G. 14
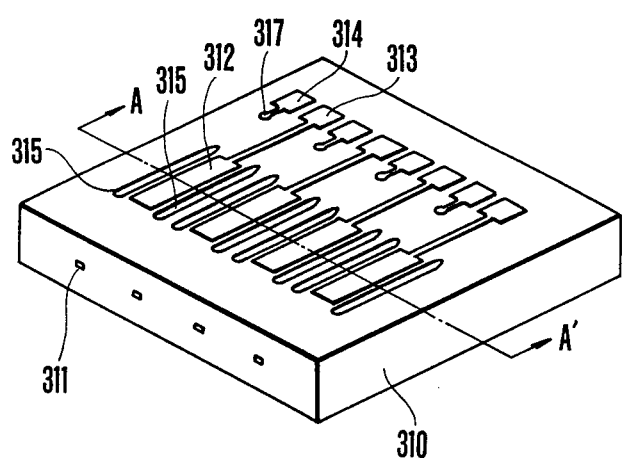
F I G. 15 (a)
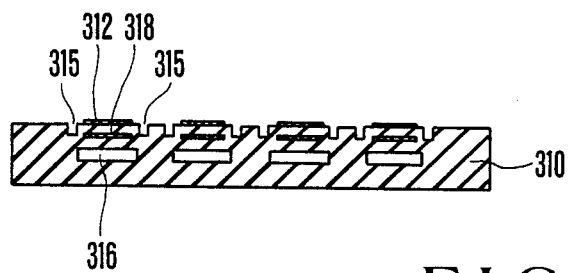
F I G. 15 (b)

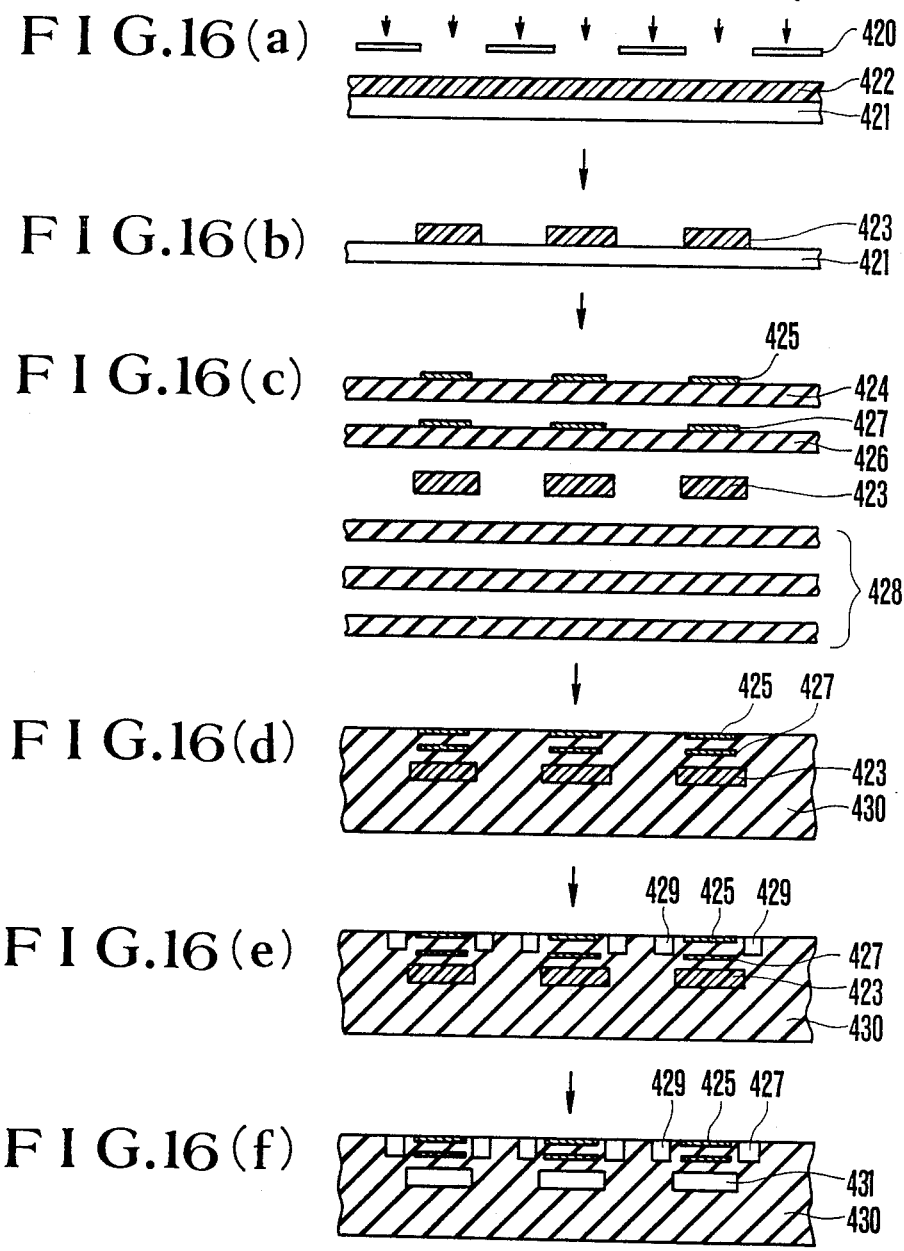

F I G. 17(a)
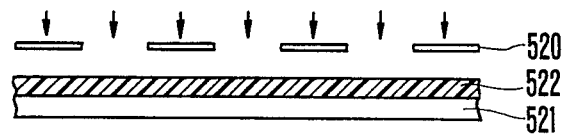
F I G. 17(b)
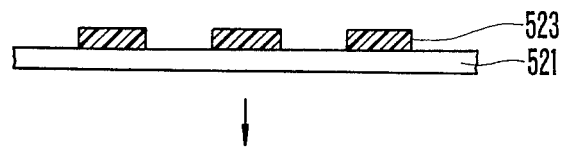
F I G. 17(c)
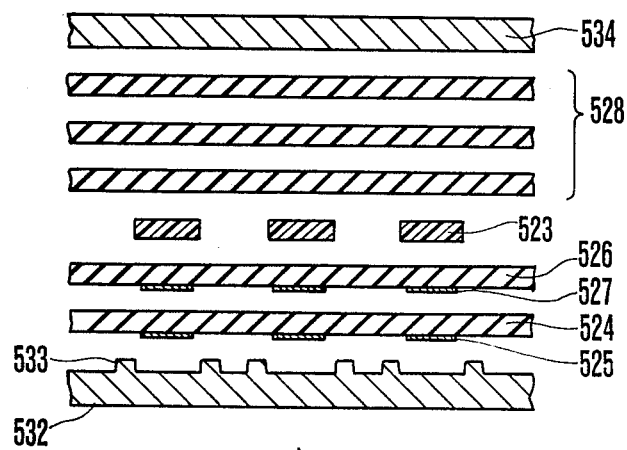
F I G. 17(d)
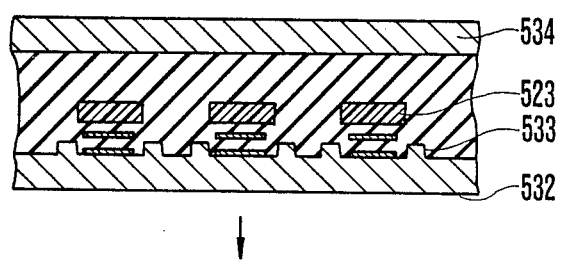
F I G. 17(e)
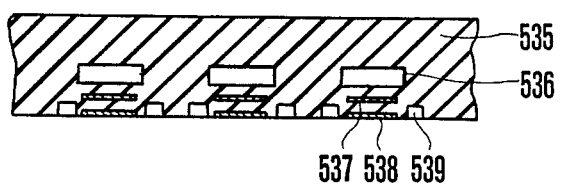

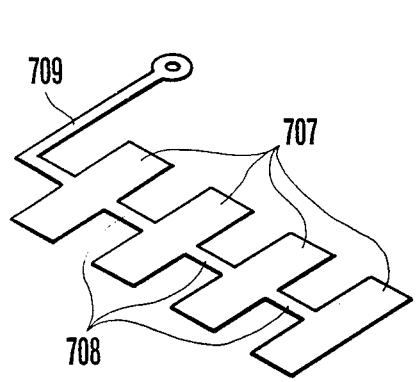
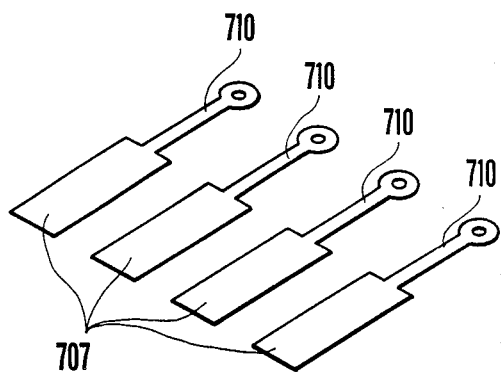
FIG.20(a)   FIG.20(b)
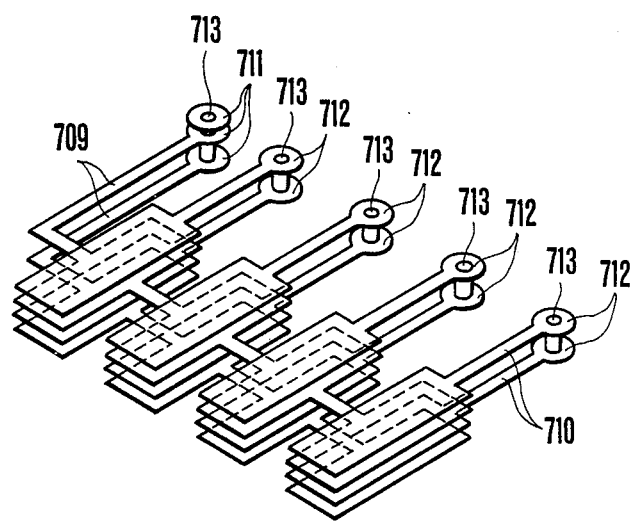
FIG.21

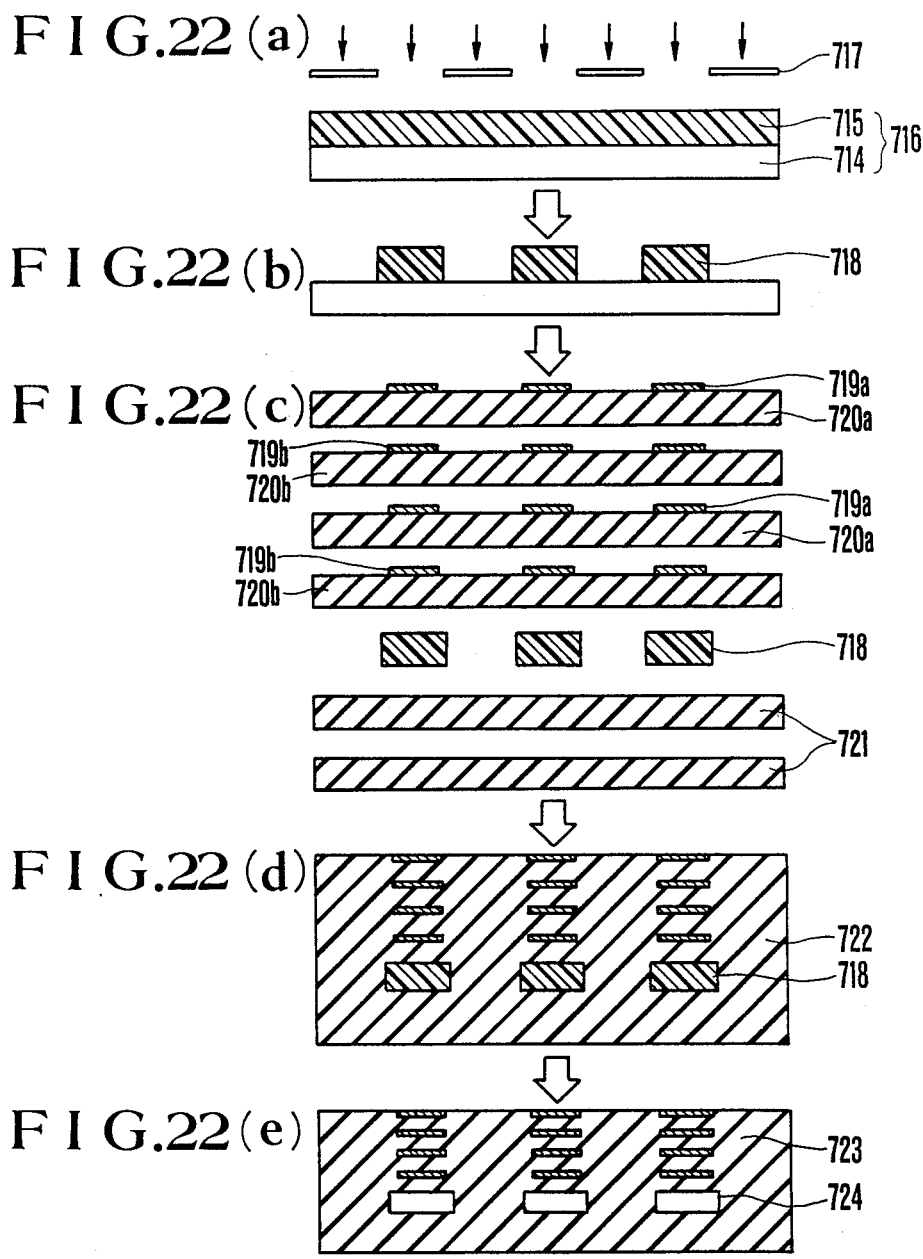

METHOD OF MANUFACTURING CERAMIC ELECTRONIC DEVICE

BACKGROUND OF THE INVENTION

The present invention relates to a ceramic electronic device and a method of manufacturing the same.

In order to form cavities in ceramic electronic devices according to conventional methods, a paste such as a carbon paste to be decomposed and removed at a temperature up to a ceramic sintering temperature is coated in ceramic plates, or a press plate is compressed on a ceramic green sheet. For example, in order to prepare a conventional laminated ceramic capacitor, a paste containing carbon is coated on a green sheet, and sheets including the sheet with a paste layer were stacked, pressed and sintered to form cavities at the paste portions. Thereafter, a metal such as silver, lead or tin is impregnated in the cavities under pressure to form internal electrodes (Fabrication of Multilayer Ceramic Capacitors by Metal Impregnation; IEEE TRANSACTION ON PARTS, HYBRIDS, AND PACKAGING, VOL. PHP-9, No. 3 September 1973, pp. 144–147).

The first drawback of a piezoelectric electroacoustic transducer device prepared by conventional techniques lies in the fact that a piezoelectric plate, an elastic plate, and a casing are separately prepared and are finally assembled together. In order to assemble such devices in the mass production line, a large number of assembly steps are required. Even if an automated assembly system is used, a considerably high investment capital is required, thus increasing the product cost.

The second drawback of the piezoelectric electroacoustic transducer device is degradation of the performance and reliability caused by adhering the piezoelectric and elastic plates by an adhesive or the like. If a bending resonator is flexed upon reception of an electrical signal or an external sound pressure, a large stress is concentrated in the adhesion layer portion. If the transducer is driven at a large amplitude for a long period of time, the adhesion layer is damaged. In addition, vibration energy is absorbed in the adhesion layer to degrade operational efficiency. Furthermore, the temperature characteristics of the transducer are degraded by an influence of the adhesive.

The third drawback of the piezoelectric electroacoustic transducer device is the limitations of a decrease in thickness of the piezoelectric plate. The resonant frequency of the bending resonator is proportional to its thickness and is in inverse proportion to the square of its diameter. In order to obtain a compact transducer device usable in a low frequency, the thickness of the piezoelectric plate must be minimized. In the process for preparing a thin piezoelectric plate, its thickness is limited, as described above. Even if a thin piezoelectric plate is prepared, it is mechanically damaged when it is adhered to the elastic plate. Therefore, as compared with the case wherein a piezoelectric plate having a relatively large thickness is used, the yield of the piezoelectric plates is greatly decreased.

The fourth drawback of the piezoelectric electroacoustic transducer device is to require fine finish for forming a flat surface of the piezoelectric plate. Upon adhesion of the piezoelectric plate to the elastic plate, if the piezoelectric plate is warped or has a large recess, the plate is damaged and the contact density of the piezoelectric plate adhered to the elastic plate is undesirably decreased. Furthermore, incomplete adhesion also leads to the degradation of energy conversion efficiency of the bending resonator.

In a conventional ink-jet head, a metal press plate is pressed on a green sheet or an acrylic die is set in a green sheet, thereby forming cavities U.S. Pat. No. 4,648,786.

However, according to the conventional cavity or space formation method, satisfactory precision cannot be obtained, or the height of the cavity is undesirably small. In order to form a cavity pattern by screen printing such that a carbon paste to be decomposed and removed at a high temperature is coated on the green sheet, the minimum order is restricted to the formation of a micropattern having a width of 100 $\mu$m at a pitch of 200 $\mu$m. In this case, the pattern has only a maximum height of 10 $\mu$m. Therefore, the resultant cavity is not enough to be used as a cavity for electronic device.

In the conventional case of forming cavities by using a metal press plate or a plastic film press plate, deformation under pressure results in degradation of precision of the pattern.

In particular, if a recess is formed on the green sheet under pressure by using a metal press plate, a ceramic sheet serving as a cover member is stacked thereon and thermally pressed. In this case, part of the overlying green sheet is undesirably inserted in the recess to cause irregular depths of the cavities.

Even if an acrylic sheet is used as a press plate and inserted in the green sheet, the acrylic sheet is deformed, thus degrading the dimensional precision.

In general, the ceramic electronic devices are operated through electrodes. According to a conventional preparation method, it is difficult to form an electrode inside the ceramic body or at a surface portion defining the cavity formed therein. According to the conventional method, after the ceramic sheet is sintered, a thick film is printed or plated to form electrodes on the resultant structure.

According to this method, the electrodes are formed on only the surface of the resultant structure. The use of a piezoelectric ceramic material limits a variety of applications. As a result, it is very difficult to prepare high-performance electronic devices.

In an ink-jet head described in U.S. Pat. No. 4,648,786, ink ejection members such as an ink supply member, an ink channel groove, and an nozzle are made of a ceramic material. In this head, a metal press plate is compressed on a green sheet to form grooves. An acrylic die is pressed and inserted in the green sheet, and another ceramic green sheet serving as a cover member is placed thereon. The stacked sheets are then pressed and sintered. After sintering, a means for generating or applying mechanical vibrations is formed on the upper surface of the sintered body. As shown in FIG. 2, a piezoelectric sheet is used as an upper cover member 010 and sintered. After sintering, driving electrodes 012 and 013 are formed on the both major surfaces of the upper cover member 010.

By using this ceramic body, the upper cover member 010 can be easily adhered to a plate 009 with ink channel grooves. However, the conventional head does not have high precision of ink channels. The nozzle tip is not maintained in the top condition so that the ink ejection is warped.

Grooves for the ink channels are formed by etching, as shown in FIGS. 1(a) and 1(b). In this case, the etching precision has limitations. Variations in nozzle diameter greatly degrading the ink injection characteristics are undesirably increased. In the head structure of FIGS. 1(a) and 1(b), nozzle apertures are constituted by stacking a cover plate 006 on a base plate 001. If misalignment between the plates 006 and 001 occurs at their corresponding edges, ink drops are warped toward a direction of an extended one of the plates 001 and 006. In general, after the base plate 001 is bonded to the cover plate 006, the edge of the nozzle portion is cut or polished to eliminate a step on the adhesion end face. In this case, if a metal material is used to constitute the plates 110 and 006, burrs are inserted in the nozzles by cutting and polishing. Many problems are left unsolved in order to obtain a flat nozzle end face.

When a conventional ceramic material is used, as shown in FIG. 2, it is difficult to form the ink channels with high precision using metal and plastic press plates since the ceramic material is deformed under pressure. In particular, when recesses are formed in the green sheet by using a metal plate, the green sheet serving as the cover member is partially inserted in the recesses under pressure to result in irregular depths of cavities, i.e., the ink channels. Furthermore, even if an acrylic sheet is used and pressed into the green sheet, a large pressure is required to embed the entire acrylic sheet, and the sheet is inevitably deformed to degrade the precision of ink channels.

According to a conventional method, electrodes are formed by printing a thick conductive paste film on the surface after the ceramic material is sintered. The electrodes 012 in FIG. 2 are formed by this method. In order to apply a voltage to this head, corresponding electrodes 013 are required. These electrodes 013 are formed on the inner wall surfaces defining corresponding pressure chambers 011. These electrodes can be formed by electroless plating. With this electrode structure, the wall sandwiched by the electrodes stretches or shrinks upon application of the voltage across the electrodes. Therefore, the wall does not substantially generate a force for ejecting the ink from the pressure chambers. If any, the force is not stable due to bending deformation of the wall. According to the conventional method, therefore, since the electrodes are formed only on the both sides of the pressure chamber wall portions, a sufficient pressure cannot be effectively generated.

SUMMARY OF THE INVENTION

It is an object of the present invention to solve the conventional problems described above, form microcavities in a ceramic body with high precision, and at the same time form electrodes therein, thereby providing a high-performance electronic device.

It is another object of the present invention to solve the above problems described above and provide a method of manufacturing a high-performance piezoelectric electroacoustic transducer device which is compact and lightweight and has a high yield with good reproducibility at low cost in a mass production line.

It is still another object of the present invention to solve all conventional problems described above and to provide a high-performance ink-jet head wherein ink channels are formed in a ceramic body with high precision and at the same time electrodes can be formed inside the ceramic body.

According to an aspect of the present invention, there is provided a method of manufacturing a ceramic electronic device, comprising the steps of forming a pattern of a predetermined shape by a material to be decomposed or removed upon heating of a ceramic material at a temperature not more than a sintering temperature thereof, forming an electrical circuit element on a ceramic green sheet, stacking the pattern, the ceramic green sheet with the electrical circuit element, and at least one ceramic green sheet to prepare a laminated body, and sintering the laminated body.

According to another aspect of the present invention, there is provided a ceramic electronic device comprising an integral ceramic laminated body including a microcavity and the electrical circuit element, both of which are formed inside the laminated body by the method described above.

BRIEF DESCRIPTION OF THE DRAWINGS

FIGS. 12(a) and 12(b) are respectively a partially cutaway perspective view and a sectional view of still another embodiment of a ceramic electronic device according to the present invention;

FIG. 14 is a sectional view showing still another embodiment of a ceramic electronic device according to the present invention;

FIGS. 15(a) and 15(b) are respectively a perspective view and a sectional view of still another embodiment of a ceramic electronic device according to the present invention;

FIGS. 16(a) to 16(f) are sectional views for explaining the steps in manufacturing the ceramic electronic device in FIGS. 15(a) and 15(b);

FIGS. 17(a) to 17(e) are sectional views for explaining other steps in manufacturing the ceramic electronic device in FIGS. 15(a) and 15(b);

FIGS. 20(a) and 20(b) are perspective views showing the electrode patterns in the embodiment of FIG. 19;

FIG. 21 is a perspective view showing the electrode connections in the embodiment of FIG. 19; and FIGS. 22(a) to 22(e) are sectional views for explaining the steps in manufacturing the ceramic electronic device in FIG. 19.

DETAILED DESCRIPTION OF THE PREFERRED EMBODIMENTS

Preferred embodiments of ceramic electronic devices and its fabrication methods according to the present invention will be described with reference to the accompanying drawings.

Figure 1A:
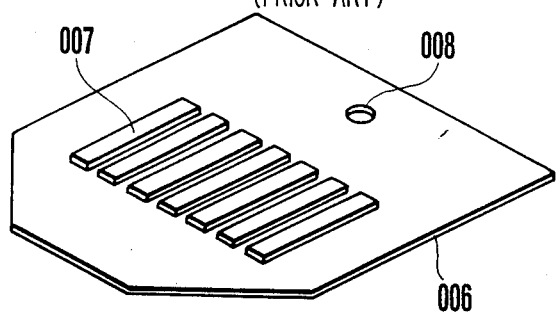
FIGS. 1(a) and 1(b) are perspective views showing a conventional ceramic electronic device.
Figure 1B:
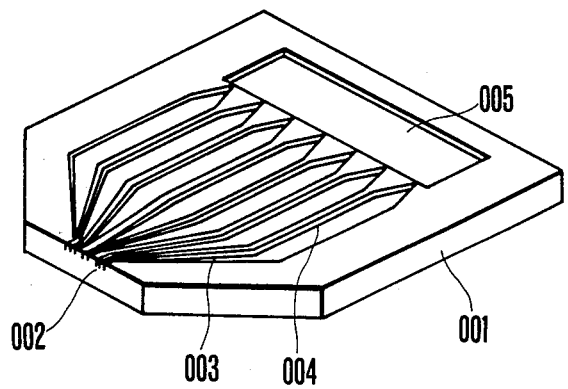
Figure 2:
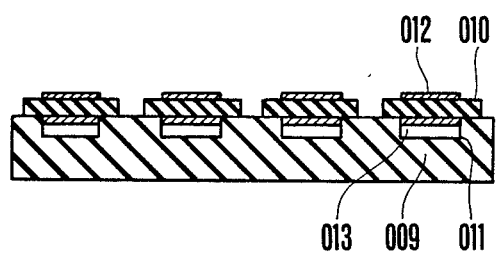
FIG. 2 is a sectional view showing another conventional ceramic electronic device.
Figure 3A:
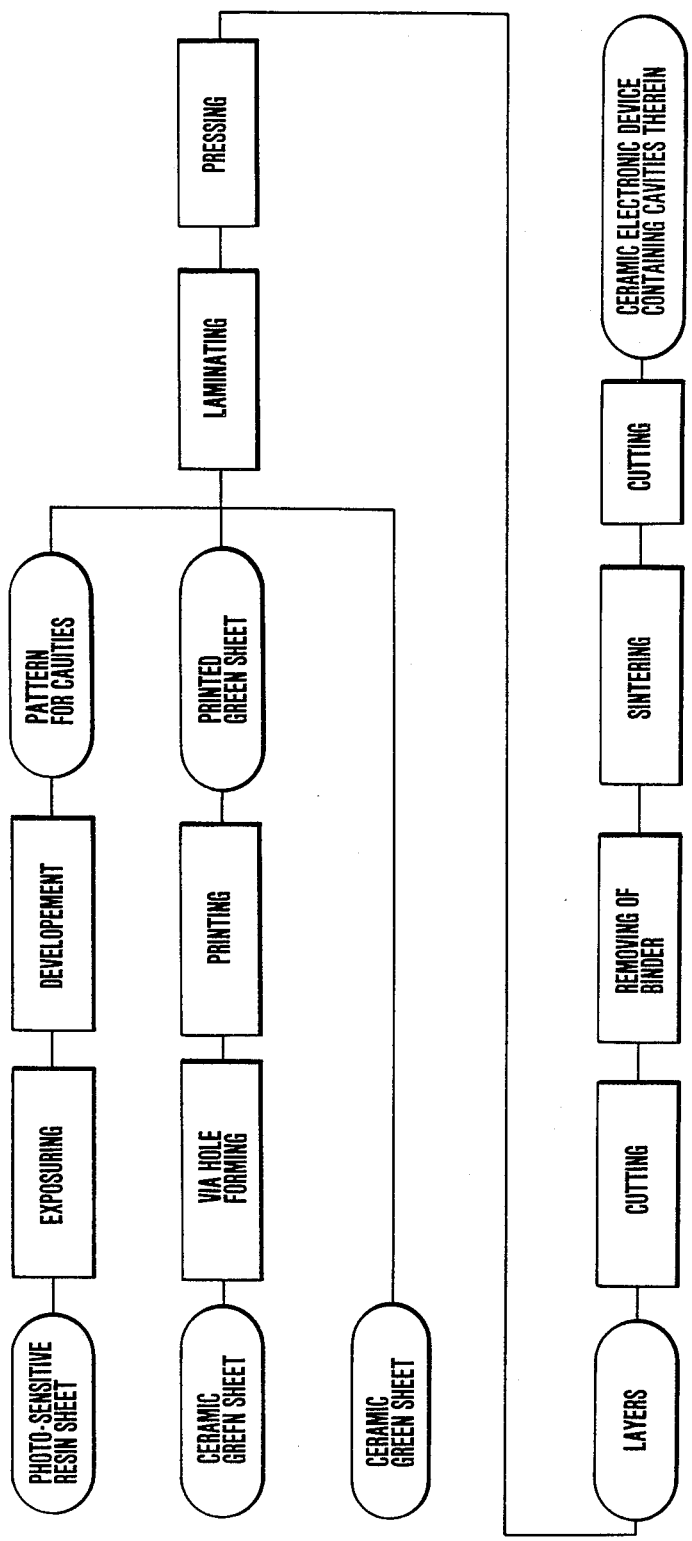
FIG. 3A shows a fabrication process of an embodiment of a method of manufacturing a ceramic electronic device according to the present invention.
Figure 3B:
FIGS. 3B(a) to 3B(f) are sectional views for explaining the steps in the fabrication process of FIG. 3A.
Figure 3B:
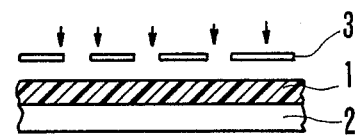
Figure 3B:
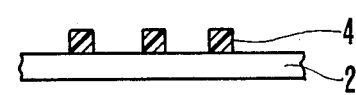
Figure 3B:
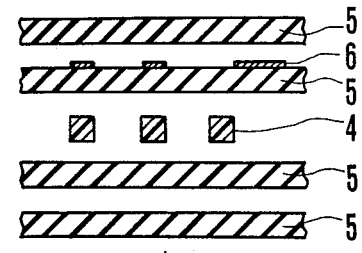
Figure 3B:
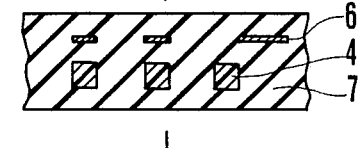
Figure 3B:
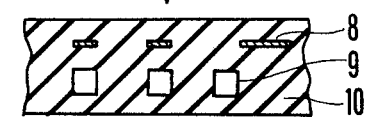

FIG. 3A and FIGS. 3B(a) to 3B(f) show the process for manufacturing a ceramic electronic device. A photosensitive resin 1 is coated on a carrier film 2 such as a polyester film to form a resin sheet having a predetermined thickness. A photomask 3 having a predetermined pattern is brought into contact with the resin sheet, and the resin sheet is exposed with light. The exposed resin sheet is then developed to form a predetermined cavity pattern 4. A ceramic green sheet 5 is prepared in the following manner. A ceramic powder, an organic binder, and a plastisizer are mixed and dispersed in a solvent to obtain a slurry according to a known method. The slurry is applied to a plastic film, a glass plate, or a metal sheet by a doctor blade method or casting, and is dried to prepare the ceramic green sheet 5.

The ceramic green sheet is peeled from the film or plate after the sheet is dried. The resultant ceramic green sheet is punched or cut to obtain a predetermined size. Through holes are formed in the resultant green sheet by punching or the like, and an electrode paste 6, a resistive paste, or a dielectric paste is printed on the surface of the ceramic green sheet.

The cavity pattern 4 is peeled from the carrier film 2 and placed together with the ceramic green sheet 5 in a press mold such that the cavities, electrodes and other patterns are three-dimensionally arranged. The stacked body is compressed to obtain a laminated body. In this case, heat may be applied under pressure, as needed.

A resultant laminated body 7 is cut into portions of a predetermined size. An organic material contained in the cavity pattern and the ceramic green sheets is gradually heated, decomposed, and oxidized in an oxygen atmosphere in the binder removing step. In this case, such an organic material is normally completely decomposed and oxidized when it is heated to a temperature of 500° C. to 600° C. However, if a temperature rise is abrupt, the laminated body 7 itself is damaged. The rate of temperature rise is 25° C./hour or less, and the temperature is kept at 500° C. to 600° C. for a long period of time, so that the organic material is completely removed.

After the binder removing step is completed, no organic material is left in the laminated body. The cavity pattern is left as cavities 9 in the laminated body. The laminated body is then sintered at a predetermined temperature to obtain a ceramic body 10. The ceramic body 10 is cut into pieces of a predetermined size, as needed, thereby obtaining ceramic electronic devices.

Figure 4A:
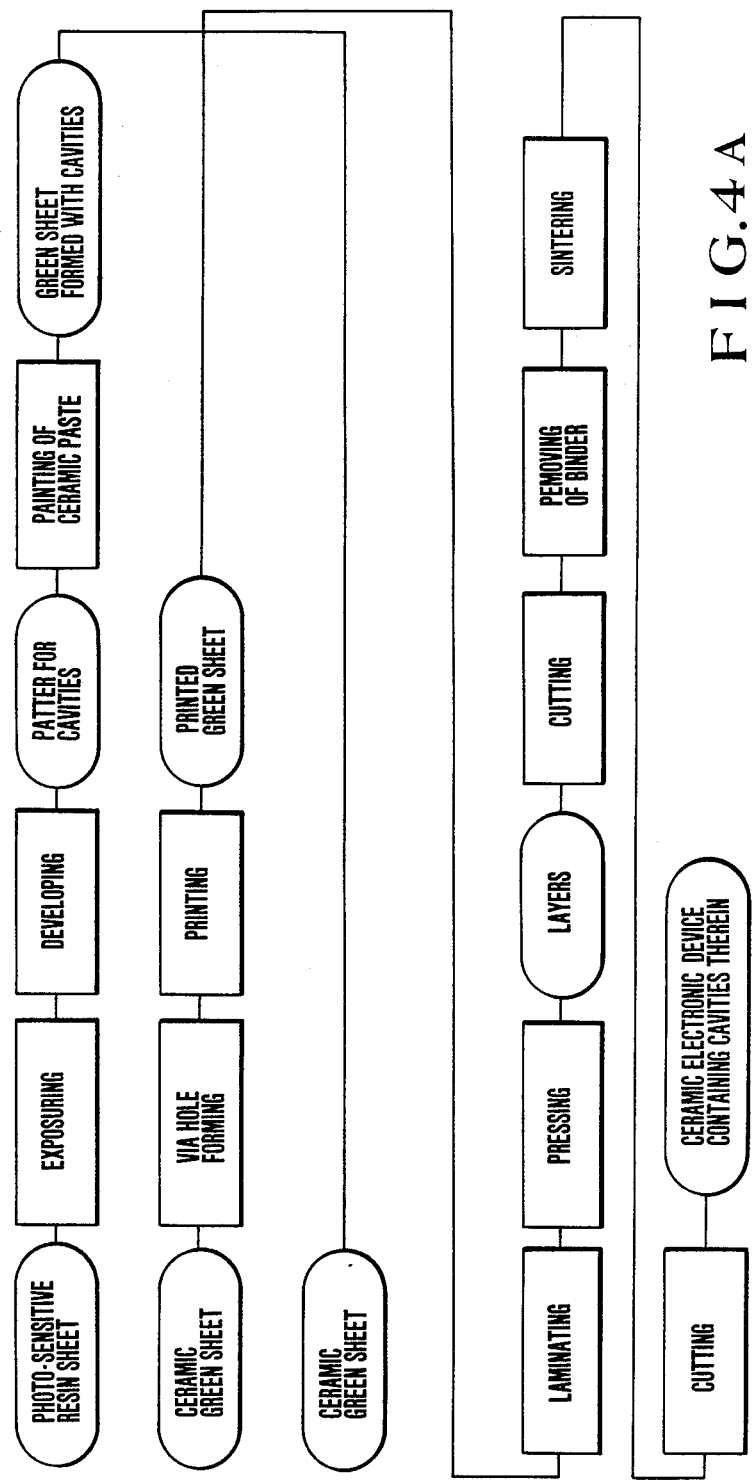
FIG. 4A shows a fabrication process of another embodiment of a method of manufacturing a ceramic electronic device according to the present invention.
Figure 4B:
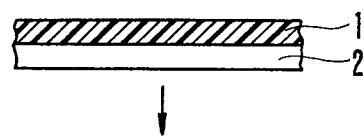
FIGS. 4B(a) to 4B(g) are sectional views for explaining the steps in the fabrication process of FIG. 4A.
Figure 4B:
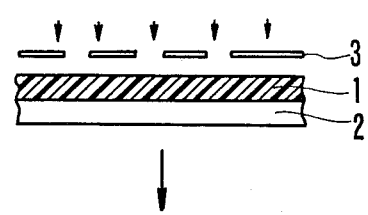
Figure 4B:
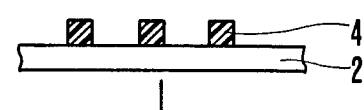
Figure 4B:
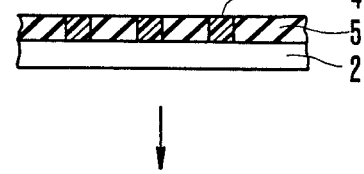
Figure 4B:
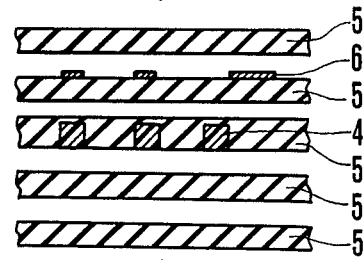
Figure 4B:
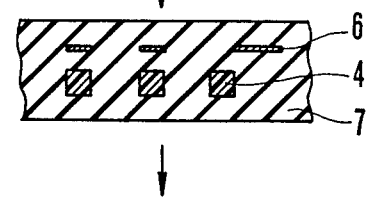
Figure 4B:
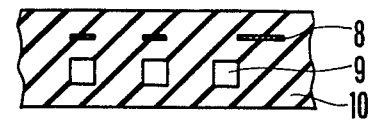

FIG. 4A and FIGS. 4B(a) to 4B(g) show another embodiment of a method of manufacturing a ceramic electronic device according to the present invention. The method in FIG. 4A and FIGS. 4B(a) to 4B(g) differs from that in FIG. 3A and FIGS. 3B(a) to 3B(f) in the following points.

A ceramic paste having the same powder and the same binder composition as those of the ceramic green sheet described above, or a slurry obtained by dispersing a ceramic powder in a solvent is applied by screen printing or casting to a cavity pattern 4 formed on a carrier film 2. The resultant ceramic layer is dried to obtain a ceramic sheet.

According to this method, a green sheet 5 with the cavity pattern being embedded therein is formed.

The green sheet 5 with the cavity pattern 4 is punched to obtain a sheet of a predetermined size. The resultant green sheet is stacked together with other green sheets in a mold such that cavities, electrodes, and other printed patterns are three-dimensionally arranged. The stacked sheets are compressed to obtain a laminated body. In this process, heat may be applied under pressure, as needed.

In the above methods, it is important to use a photosensitive resin to obtain a microcavity pattern with high precision. It is also important to prepare a ceramic green sheet with a cavity pattern, laminate it with another ceramic green sheet with spaces corresponding to the cavity pattern, and press a laminated body, unlike in the case wherein the cavity pattern is embedded in the ceramic sheet under pressure.

Examples of the photosensitive resin are photocurable acrylic resin, nylon resin, epoxy resin, polyurethane resin, and polybutadiene resin. The pressing temperature is a glass transition temperature of a binder resin used in the green sheet. A small amount of solvent may be sprayed onto the green sheet prior to pressing.

Since the cavity pattern is made of a photosensitive resin, a micropattern can be formed with high precision.

When a photosensitive resin is used, patterns each having a width of 10 $\mu$m may be easily formed at pitches of 20 $\mu$m according to current patterning techniques. In addition, the height of the cavity can be increased to a maximum of several millimeters. Therefore, an aspect ratio as the ratio of width to thickness of the pattern can be 1 or more.

In the cavity or space formation process, if the cavity pattern is embedded into the green sheet under pressure, as in the conventional technique, the depth of the cavity pattern is limited to up to about several microns. Furthermore, in order to deeply embed the cavity pattern in the green sheet, a high pressure is required, thus causing deformation of the cavity pattern and hence resulting in precision degradation.

However, according to the method of the present invention, the photosensitive resin is exposed with light through a photomask. A ceramic paste having the same binder composition as that of the ceramic sheet or a slurry is applied to the developed cavity pattern by screen printing or casting (e.g., the doctor blade method). The applied paste or slurry is dried to fill the recesses defined by the cavity pattern, thereby obtaining a flat surface of the cavity pattern.

In the subsequent step, i.e., laminating and pressing, a uniform pressure is applied to the cavity pattern to greatly decrease the deformation of the cavity pattern and to improve the dimensional precision of cavities.

Furthermore, electrodes are formed on the surfaces of the ceramic green sheets to form electrodes inside the sintered ceramic body, on ceramic inner walls defining the cavities, and on outer surface of the ceramic body. By forming the through holes in the ceramic green sheets, the electrodes formed on the surface of the cavity pattern, inside the ceramic body, and on the outer surface of the ceramic body can be three-dimensionally wired.

In addition to metal conductors, a resistor green sheet, a dielectric green sheet, and a ceramic green sheet with an electrode the material of which is different from the metal conductors described above may be expected to be connected so as to provide a structure having electronic and electric functions.

Figure 5:
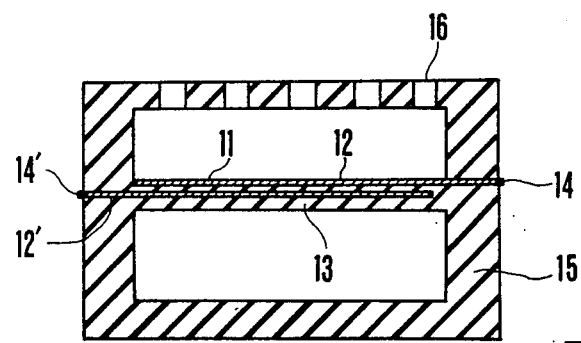
FIG. 5 is a sectional view showing an embodiment of a ceramic electronic device according to the present invention.

FIG. 5 shows an embodiment of a piezoelectric electroacoustic transducer device. Referring to FIG. 5, a sound wave transmitting/receiving piezoelectric plate 11, electrodes 12 and 12', an elastic plate 13, and a case 15 are integrally formed with each other. Other portions excluding the electrodes are made of a piezoelectric ceramic material. In the sound wave transmission mode, an AC electrical signal is supplied between electrode terminals 14 and 14'. The piezoelectric plate 11 sandwiched between the electrodes 12 and 12' stretches or shrinks along the horizontal direction by a piezoelectric effect. However, since the piezoelectric plate 11 is bonded to the elastic plate 13 which is piezoelectrically inactive, an integral body constituted by the piezoelectric plate 11, the electrodes 12 and 12', and the elastic plate 13 is bent upward or downward. In this manner, the input electrical signal is transduced into acoustic energy, so that a sound is produced outside through through holes 16 formed in the upper wall of the case 15.

The sound wave transmitting/receiving plate 11 is simultaneously integrally formed with the case, and no adhesive is used to prepare such an integral body. Therefore, all drawbacks of the devices manufactured by the conventional methods can be eliminated.

Figure 6:
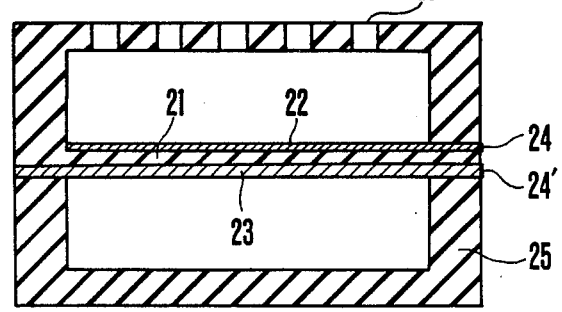
FIG. 6 is a sectional view showing another embodiment of a ceramic electronic device according to the present invention.

FIG. 6 shows another electroacoustic piezoelectric transducer according to the present invention. In this embodiment, a piezoelectric plate 21 is sandwiched between metal electrodes 22 and 23. The metal electrode 23 also serves as an elastic plate. A metal has a higher bending strength than a piezoelectric ceramic material. It is therefore possible to increase the mechanical strength of the sound wave transmitting/receiving plate as compared with the construction of FIG. 5.

An embodiment of a piezoelectric ceramic resonator prepared by the method of the present invention will be described with reference to FIG. 7.

Figure 7:
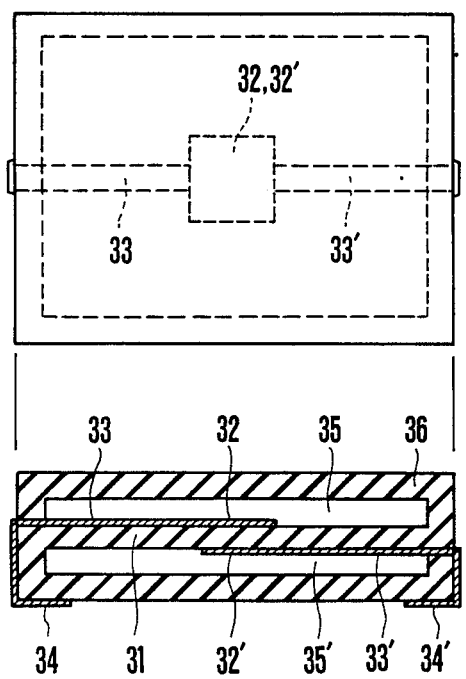
FIG. 7 is a view showing planar and sectional structures of still another embodiment of a ceramic electronic device according to the present invention.

FIG. 7 shows an embodiment of the ceramic resonator according to the present invention. Referring to FIG. 7, metal electrode films 32 and 32' are formed on the upper and lower surfaces of a ceramic piezoelectric resonant plate 31 at the center thereof. The metal electrode films 32 and 32' are connected to external pads 34 and 34' through electrode leads 33 and 33', respectively. The cavities 35 and 35' are formed to allow free resonance of the resonant plate 31. The resonant plate 31 is disposed in a protective case 36 made of the same material as the resonant plate 31. Since the protective case 36 is integrally formed with the resonant plate 31 in the piezoelectric resonator having the construction described above, a separate protective case and a molding resin for protecting the resonator need not be used. In addition, assembly and molding are eliminated. Since the resonant plate, the electrodes and the protective case are simultaneously integrally formed by tape casting to prepare the resonator shown in FIG. 7, it is suitably manufactured in a mass production line. Therefore, the fabrication cost can be greatly reduced.

Figure 8:
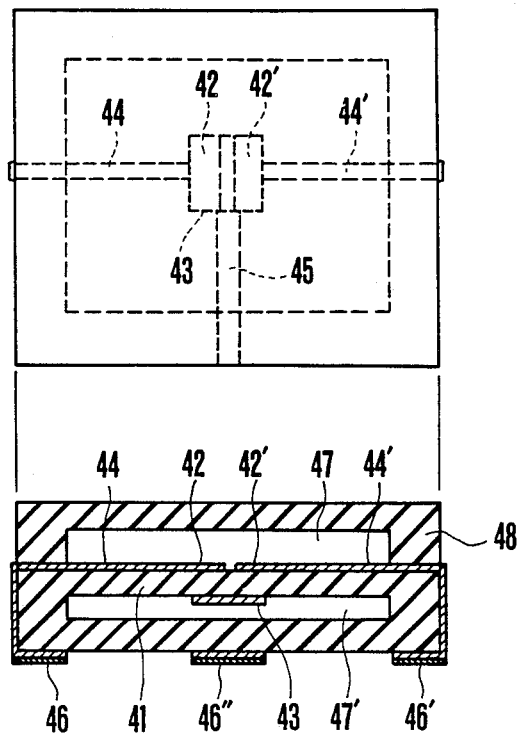
FIG. 8 is a view showing planar and sectional structures of still another embodiment of a ceramic electronic device according to the present invention.

FIG. 8 shows another embodiment of a ceramic resonator according to the present invention. Referring to FIG. 8, the electrode film formed on the upper surface of a resonant plate 41 is divided into electrode films 42 and 42'. The films 42 and 42' are connected to external electrode pads 46 and 46' through electrode leads 44 and 44', respectively. An electrode film 43 is formed on the lower surface of the resonant plate and is connected to an external electrode pad 46' through an electrode lead 45, thereby constituting a 3-terminal filter. The resonator in FIG. 7 is a single mode resonator, while the resonator in FIG. 8 is a double mode filter.

Figure 9A:
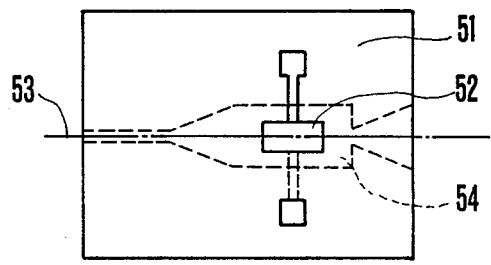
FIGS. 9(a) and 9(b) are respectively a plan view and a sectional view of still another embodiment of a ceramic electronic device according to the present invention.
Figure 9B:
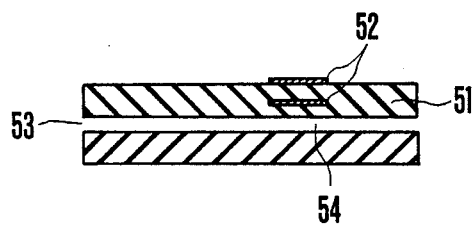

FIGS. 9(a) and 9(b) are respectively a plan view and a sectional view of an on-demand ink-jet head with integral electrodes. In the on-demand ink-jet head, a piezoelectric ceramic body 51 comprised a $PbTiO_3$-$PbZrO_3$ based ceramic material. Electrodes 52 were made of an electrode paste having an Ag/Pd ratio of 70/30 (mass ratio). A photosensitive resin for forming a cavity pattern was an UV curable acrylic resin to be cured with ultraviolet rays, and the exposed resin was developed by methyl ethyl ketone.

The ceramic green sheet and the green sheet with the cavity pattern embedded therein were pressed at a pressure of 250 kg/cm$^2$ and at a temperature of 110° C. for 30 minutes.

The laminated body was heated in air at a rate of temperature rise being 5° C./hour. The laminated body was kept at 500° C. for 3 hours to decompose and oxidize the organic material. Sintering of the laminated body was performed in air at 1,150° C. for 2 hours.

An AC voltage of 40 V was applied to the electrodes of the resultant ink-jet head, the electrode formation portion was vibrated by the piezoelectric effect. In this case, ink drops were ejected from a nozzle 53. The nozzle cross-section had a rectangular shape with each side of 100 μm. A cavity at a pressure chamber 54 had a height of 100 μm and a maximum width of 5 mm.

Figure 10A:
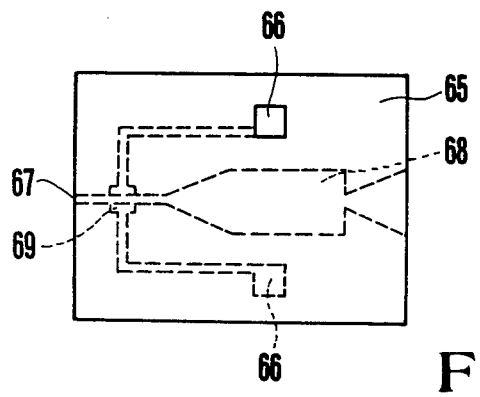
FIGS. 10(a) and 10(b) are respectively a plan view and a sectional view of still another embodiment of a ceramic electronic device according to the present invention.
Figure 10B:
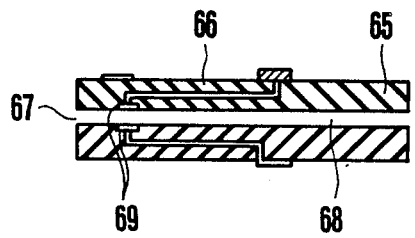

FIGS. 10(a) and 10(b) are respectively a plan view and a sectional view of another on-demand ink-jet head according to the present invention. In this head, a powder mixture of lead borosilicate glass and alumina was used a material for an insulating ceramic body 65. A paste for conductive films 66 had an Ag/Pd ratio of 85/15 (weight ratio). A photosensitive resin for a cavity pattern was a UV curable nylon resin to be cured with ultraviolet rays. The exposed resin pattern was developed by an alkali. The ceramic green sheet and the green sheet with the cavity pattern contained therein are pressed at a pressure of 300 kg/cm$^2$ at a temperature of 80° C. Heater resistors 69 for generating bubbles were formed by a ruthenium oxide paste. After the organic material was decomposed at a temperature of 500° C., and the laminated body was sintered at 900° C. for 2 hours.

An ink is filled in an ink fountain 68, and an RF pulse is applied to the resistors 69 in the ink-jet head. In this case, the ink was found to be injected from a nozzle 67. The opening size of the nozzle 67 was 50 μm×50 μm.

Figure 11A:
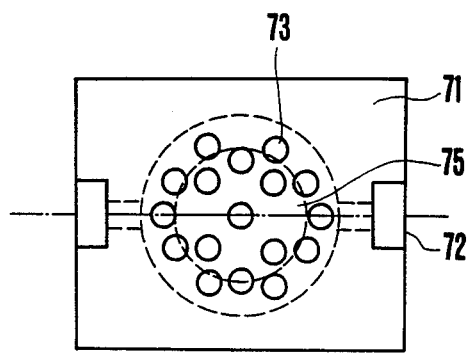
FIGS. 11(a) and 11(b) are respectively a plan view and a sectional view of still another embodiment of a ceramic electronic device according to the present invention.
Figure 11B:
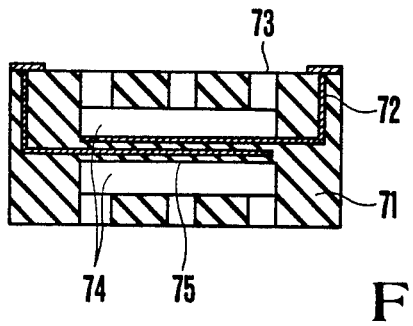

FIGS. 11(a) and 11(b) are respectively a plan view and a sectional view of a piezoelectric sound generator.

A PbTiO$_3$-PbZrO$_3$ based piezoelectric material was used as a material for a piezoelectric body 61, and platinum was used as an electrode material.

A 500-μm thick epoxy-based material was used as the photosensitive resin for forming a cavity pattern. Air chambers 74 were formed in the interior of the sound generator through a driving portion (including electrodes 71) of the piezoelectric ceramic body 61. The air chambers 74 communicated with an outer atmosphere through cavities 73. Electrodes 72 were arranged in the ceramic body 61. After a laminated body was sintered to obtain the ceramic body 61, an AC voltage was applied between the electrodes 72 to produce a 1-kHz sound. In this case, portions of the case above and below the resonator are constructed to produce sound through the cavities since the cavities are formed in the corresponding portions of the green sheets.

Various types of on-demand ink-jet heads and their manufacturing methods will be described with reference to other embodiments below.

FIGS. 12(a) and 12(b) show an on-demand ink-jet head according to the present invention, in which FIG. 12(a) is a partially cutaway perspective view thereof, and FIG. 12(b) is a sectional view of the ink-jet head of FIG. 12(a) taken along the line A—A' thereof.

In this head, a ceramic substrate 80 made of a piezoelectric or electrostrictive material, an upper cover(I) 85, and an upper cover(II) 87 are stacked together. In this case, the contact portions between the substrate 80 and the upper cover(I) 85 and between the upper cover(I) and the upper cover(II) are integrally formed. Cavities for nozzle apertures 81, ink channels 82, pressure chambers 83, and a common ink chamber 84 to which an ink is externally supplied are formed in the flat laminated body. Electrodes 88 are embedded and interposed between the upper cover(I) 85 and the upper cover(II) 87. The internal electrodes 88 are connected to a terminal 91 through a wiring pattern 89 embedded in the laminated body and a through hole 90 formed in the upper cover(I) 85 and the upper cover(II) 87. Other electrodes 86 are formed on the outer surface of the upper cover(II) 87 and are respectively connected to terminals 93 through wiring patterns 92. As shown in FIG. 12(b), the electrodes 86 and 88 are formed on parts of the walls defining the pressure chambers 83. Upon application of a voltage across the electrodes, only the wall portions sandwiched therebetween are subjected to stretch and shrinkage. As a result, the wall portions are curved toward the pressure chambers to apply a pressure to the ink stored therein. The shape of electrode is not limited but preferably the substantially same as that of the corresponding pressure chamber from the viewpoint of efficiency. One of the electrodes 86 and 88 preferably has a width smaller than that of the corresponding pressure chamber.

The nozzle end is finished by a known cutting method using a wire saw, a diamond cutter, or the like to obtain a sharp nozzle edge since the head is made of the ceramic material and does not produce burrs upon its cutting. The cut nozzle edge may be polished to obtain a smooth end face. In this case, burrs are not produced either.

A method of manufacturing the head of FIGS. 12(a) and 12(b) will be described below.

FIGS. 13(a) to 13(e) show a method of manufacturing the head of FIGS. 12(a) and 12(b), for explaining the steps from ink channel pattern formation to sintering of the laminated body. The ink channel pattern is formed as follows. A photosensitive resin 226 is uniformly coated on a carrier film 225 such as a polyester film to form a resin layer having a predetermined thickness. The resin layer is exposed with light through a photomask having an ink channel pattern (FIG. 13(a)). Thereafter, the exposed resin pattern is developed to obtain a predetermined channel pattern 228 (FIG. 13(b)).

A ceramic powder, an organic binder, and a plasticizer are mixed and dispersed in a solvent according to a known method to obtain a slurry. The slurry is coated on a plastic film, a glass plate, or a metal sheet by a doctor blade method or casting. The slurry layer is then dried and peeled from the plastic film, the glass plate or the metal sheet to obtain a ceramic green sheet. The ceramic green sheet is punched or cut to obtain a desired shape. A conductive paste is applied by screen printing onto the sheet having the desired shape, so that desired electrode and wiring patterns are formed in order to apply voltage thereto. In this embodiment, an external electrode pattern 230 was formed on a first green sheet 229, and an internal electrode pattern 232 was formed on a second green sheet 231. Through holes are formed in the electrode connecting portions of the second green sheet.

Thereafter, the channel pattern 228 is peeled from the carrier film 225. The channel pattern 228 is stacked together with the green sheets 229 and 231 with electrode patterns, and other green sheets 233 for forming ink channels (FIG. 13(c)) in a press mold such that cavities, electrodes, and other printed patterns are three-dimensionally arranged. The stacked sheets are pressed to obtain a laminated body so as to define the channel pattern 228. In this case, heat may be used under pressure (FIG. 13(d)).

The laminated body may be cut into pieces as needed. The channel pattern resin material and the organic material contained in the ceramic green sheet are slowly heated in the oxygen atmosphere in the binder removing step to decompose and oxidize them. The organic material is normally completely decomposed and oxidized at a temperature of 500° C. to 600° C. However, an abrupt temperature rise causes the damage to the laminated body. The rate of temperature rise is 25° C./hour or less. The laminated body is then kept at a temperature of 500° C. to 600° C. for a long period of time to completely remove the organic material. After the binder is removed, the ink channel pattern resin portions in the laminated body 235 constitute an ink channel pattern 236. The external and internal electrode patterns 230 and 232 are formed on and inside the laminated body. The laminated body is then sintered at a predetermined temperature to obtain a sintered body (FIG. 13(e)). The sintered body is cut into pieces of a predetermined size as needed, and the nozzle end face is cut to prepare an ink-jet head.

A PbTiO$_3$-PbZrO$_3$ based powder was used as the ceramic powder in the fabrication process. A conductive paste having an Ag/Pd ratio of 70/30 (weight ratio) was used as the electrode material. A UV curable acrylic resin was used as the photosensitive resin for forming the ink channel pattern. The resin sheet was exposed with ultraviolet rays. Ethyl methyl ketone was used as a developing agent.

The ceramic green sheet and the ink channel pattern were pressed at a pressure of 250 kg/cm$^2$ and at a temperature of 110° C. for 30 minutes.

The lamination step was performed such that a rate of temperature rise was 5° C./hour in air, and the temperature was kept at 500° C. for 3 hours to remove the organic material. Sintering was performed in air at 1,150° C. for 2 hours.

The thickness of each green sheet was about 100 μm, and the thickness of the photosensitive resin was about 100 μm. After sintering, the sectional size of the nozzle is about 80 μm×80 μm. The height of other channels was 80 μm. A pulsed voltage of about 50 V was applied to the resultant head, and ink drops were found to be injected from the nozzles.

FIG. 14 shows still another embodiment of the ink-jet head, showing a section at the pressure chamber.

In this embodiment, the pressure chamber walls are formed to be symmetrial about the plane B—B' of FIG. 14. Electrodes 239, 240, 241, and 242 driven upon reception of the drive voltage are formed to be symmetrical about the plane B—B' in the pressure chamber wall and on the outer surface thereof. Each electrode 239 is connected to the corresponding electrode 241, and each electrode 240 is connected to the corresponding electrode 242. These electrodes receive the external drive voltage. Upper and lower wall portions are deformed symmetrically about the plane B—B', and the ink is injected from the pressure chamber 238 and is sprayed from a corresponding nozzle (not shown) communicating therewith. In this case, vibrations accompanied by deformation of the wall of the pressure chamber are transmitted to a flat head plate 237 and then to other pressure chambers, thus interfering ink injection of other nozzles and generating large noise caused by vibrations of the flat plate 237. However, since the electrodes are symmetrically arranged, the vibrations generated by the upper and lower walls are cancelled to each other because of their opposite phases. Therefore, vibrations are not substantially generated by the head plate 237. The vibration level could be reduced to 1/10 as compared with the case wherein the electrodes are arranged at one side with respect to the plane B—B'. Therefore, even if the thickness of the head is reduced, a compact head with the symmetrical electrode arrangement can be obtained at low vibration and noise levels. The wall is deformed at two locations, so that the size of the pressure chamber can be reduced into ½ as compared with the arrangement wherein the electrodes are arranged at one side with respect to the plane B—B'. If the size of the pressure chamber is kept unchanged, the level of the drive voltage can be reduced into ½.

Figure 13A:
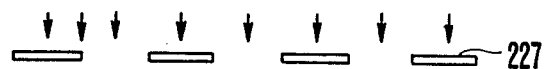
FIGS. 13(a) to 13(e) are sectional views for explaining the steps in manufacturing the device of FIGS. 12(a) and 12(b)
Figure 13B:
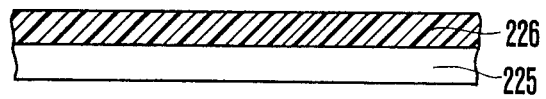
Figure 13C:
Figure 13D:
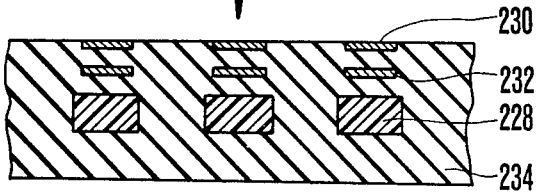
Figure 13E:
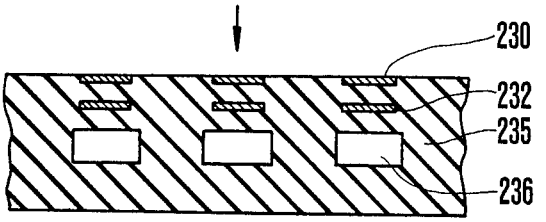

A method of manufacturing the head of FIG. 14 may be achieved such that green sheets 229 and 231 are reversely stacked in place of the green sheets 233 in FIG. 13(c).

FIGS. 15(a) and 15(b) are respectively a perspective view of still another embodiment of an ink-jet head according to the present invention, and a sectional view thereof taken along the line A—A' of FIG. 15(a).

The head in FIGS. 15(a) and 15(b) has a flat structure obtained by stacking and laminating ceramic plates of a piezoelectric or electrostrictive material. The head has pressure chambers 316 for applying a pressure to the ink upon ink injection in the same manner as in the conventional on-demand head. The pressure chambers 316 respectively communicate with nozzle apertures 311 through ink channels. Each pressure chamber has an ink inlet port connected to a common ink chamber communicating with an external ink tank. As shown in FIG. 15(b), electrodes 312 and 318 are formed in the wall defining each pressure chamber 316 and on the outer surface of the wall. The shape of each electrode is substantially the same as that of the corresponding pressure chamber. In this case, the electrode is rectangular. Each internal electrode 318 is located substantially at the center of the wall along a direction of thickness thereof.

Each internal electrode 318 is connected, through a wiring pattern embedded in the wall, to a corresponding terminal 314 via a corresponding through hole 317 formed in the wall. Each external electrode 312 is connected to a corresponding terminal 313 through a corresponding wiring pattern. Elongated grooves 315 are formed at both sides of each electrode 312. Each groove 315 has at least a depth corresponding to the level of the corresponding electrode 318. However, the depth of the groove 315 is not restricted to the one described above. In the embodiment of FIGS. 15(a) and 15(b), two grooves are formed at both sides of each of the electrodes corresponding to the plurality of pressure chambers. However, the adjacent grooves between the adjacent electrodes may be replaced with a single groove to obtain the same effect as described above. A drive voltage is applied to the terminals 313 and 314.

The polarities of the drive voltage are determined such that a layer sandwiched between the electrodes 312 and 318 stretches or shrinks by the effect of the electric field. Upon application of such a drive voltage, the stress occurs to cause the layer sandwiched between the electrode 312 and 318 to stretch or shrink. Since this portion is separated from other wall portions by the grooves formed at both sides of the corresponding electrode 312, the portion does not receive any external force which prevents stretch or shrinkage. Therefore, this portion can be effectively deformed as a bimorph element. As compared with the conventional arrangement, an identical deformation magnitude can be obtained by a small voltage amplitude. The internal stress of the wall is reduced to remove the damage to the wall caused by the stress exceeding the elastic limits of the wall and the damage to the wall caused by the fatigue.

FIGS. 16(a) to 16(f) show the steps in manufacturing the ink-jet head of FIGS. 15(a) and 15(b). PbTiO$_3$-PbZrO$_3$ based ceramic green sheets were used as a ceramic material to constitute a head body. The thickness of each green sheet was about 100 μm. A silver paste was used as the electrode material.

The green sheet is cut into pieces of a predetermined shape. The steps from ink channel pattern formation to sintering are illustrated in FIGS. 16(a) to 16(f). A photosensitive resin 422 is applied to a carrier film 421 such as a polyester film to form a resin layer having a predetermined thickness. A photomask 420 having the ink channel pattern is brought into contact with the resin layer, and the resin layer is exposed with light through the photomask 420 (FIGS. 16(a)). Thereafter, the exposed resin layer is developed to obtain a predetermined channel pattern 423 (FIG. 16(b)).

Electrode and wiring patterns for receiving a drive voltage are formed on green sheets by screen printing. In this embodiment, an external electrode pattern 425 is formed on a first green sheet 424, and an internal electrode pattern 427 is formed on a second green sheet 426. Through holes are formed in the first green sheet so as to connect the internal electrode pattern to an external wiring when the green sheets are stacked. The green sheet 424 with the electrode pattern and the through hole pattern, the green sheet 426 having the electrode pattern, other green sheets 428, and the ink channel pattern 423 peeled from the carrier film are stacked in a mold such that the cavities, the electrodes, and other printed patterns are three-dimensionally formed (FIG. 16(c)). The stacked individual sheets are pressed to constitute a laminated body so as to surround the ink channel pattern 423.

Grooves 429 are formed by a cutter between the electrodes on the laminated body 430 (FIG. 16(e)). The depth of each groove substantially corresponds to the thickness of the first green sheet 424. In other words, the grooves are formed up to the depth corresponding to the level of the internal electrodes 427.

Thereafter, the resultant laminated body is cut into pieces of a predetermined size. The ink channel pattern resin 423 and the organic material in the laminated body are removed in the binder removing step by slowly heating the laminated body in an oxygen atmosphere, so that the organic material is decomposed and oxidized. In this case, an abrupt temperature rise causes the damage to the laminated body. Therefore, the laminated body is preferably heated at a rate of 25° C./hour and is kept at a temperature of 500° C. to 600° C. for a long period of time, thereby completely removing the organic material. After this process, no resin is left in the laminated body 430, and thus cavities 431 corresponding to the ink channel pattern are formed. In addition, the electrode patterns 425 and 427 are formed on the outer surface of the laminated body and inside the laminated body, respectively.

This laminated body is sintered in air at about 1,150° C. for 2 hours to obtain a sintered body (FIG. 16(f)).

The sintered body is cut at a portion corresponding to the nozzle end face. The nozzle end face is then polished to achieve stable ink drop injection. In this embodiment, the green sheets are stacked and pressed to obtain the laminated body, and the grooves are formed in the laminated body. However, the grooves need not be formed in the laminated body, but may be formed in the sintered body to obtain the same ink-jet head as described above.

FIGS. 17(a) to 17(e) are sectional views showing other steps in manufacturing the ink-jet head of FIGS. 15(a) and 15(b). According to this method, groove formation is simultaneously performed with stacking and pressing, thereby simplifying the fabrication process.

A photosensitive resin is used to form an ink channel pattern 523, and electrodes 525 and 527 and wiring patterns are formed on green sheets 524 and 526 in the same manner as in the steps of FIGS. 16(a) and 16(b) (FIGS. 17(a) and 17(b)).

A mold 532 used for stacking has projections 533 corresponding to the grooves to be formed between the electrodes 525.

By using the mold 532, the first green sheet 524, the second green sheet 526, the channel pattern 523, and other green sheets 528 are stacked such that cavities, electrodes and the like are three-dimensionally arranged (FIG. 17(c)), and the stacked sheets are pressed to obtain a laminated body (FIG. 17(d)). The green sheets are deformed to fill the gaps therebetween and are brought into tight contact with each other to constitute the laminated body. In this case, heat may be applied under pressure. Therefore, lamination of the green sheets can be simultaneously performed with groove formation.

The laminated body 535 is cut into pieces as needed, the resin and organic material are removed in the binder removing step, and the laminated body is sintered and converted into a sintered body in the same manner as in FIG. 16(f) (FIG. 17(e)).

Figure 18A:
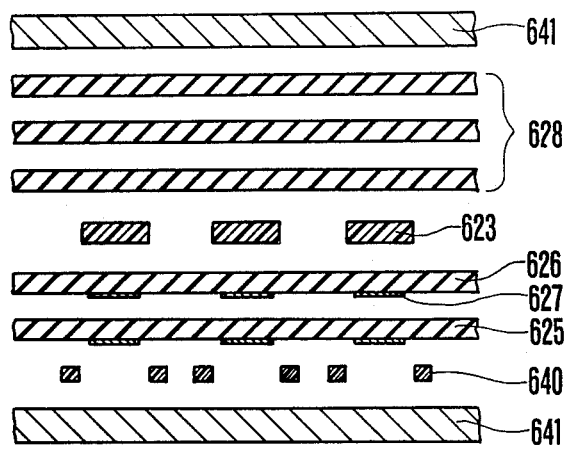
FIGS. 18(a) and 18(b) are sectional views for explaining still other steps in manufacturing the ceramic electronic device in FIGS. 15(a) and 15(b)
Figure 18B:
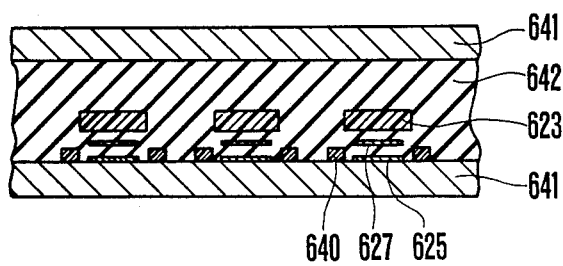

FIGS. 18(a) and 18(b) are sectional views showing stacking and pressing steps according to still another embodiment of a method of manufacturing the ink-jet head of FIGS. 15(a) and 15(b). In the process of FIGS. 18(a) and 18(b), deformation of grooves is improved when the laminated body is released from the mold with projections used in FIGS. 17(c) and 17(d).

In the process of FIGS. 18(a) and 18(b), a groove pattern 640 is formed between the electrodes by using a photosensitive resin for forming an ink channel pattern. In stacking of FIG. 18(a), a groove pattern 640, green sheets 624 and 625 having electrode and wiring patterns, an ink channel pattern 623, and other green sheets 628 are stacked in a mold 641 such that grooves, cavities, and electrodes are three-dimensionally arranged. In pressing of FIG. 18(b), the stacked sheets and patterns are pressed to obtain a laminated body.

In pressing of FIG. 18(b), the groove pattern 640 is embedded into the corresponding green sheet.

The laminated body 642 is heated in an oxygen atmosphere in the binder removing step to decompose and oxidize the organic material such as a resin. Therefore, the ink channel pattern and the grooves are formed.

In this process, the groove pattern is formed by using the photosensitive resin. However, the process for forming the groove pattern is not limited to this method. For example, grooves may be formed by a plastic film punched so as to have a groove pattern shape.

In this process, since the groove pattern of a resin is embedded in the green sheet, and removing of binding is performed, the grooves are not deformed and hence a head having little variations in characteristics of the nozzles can be obtained.

Figure 19:
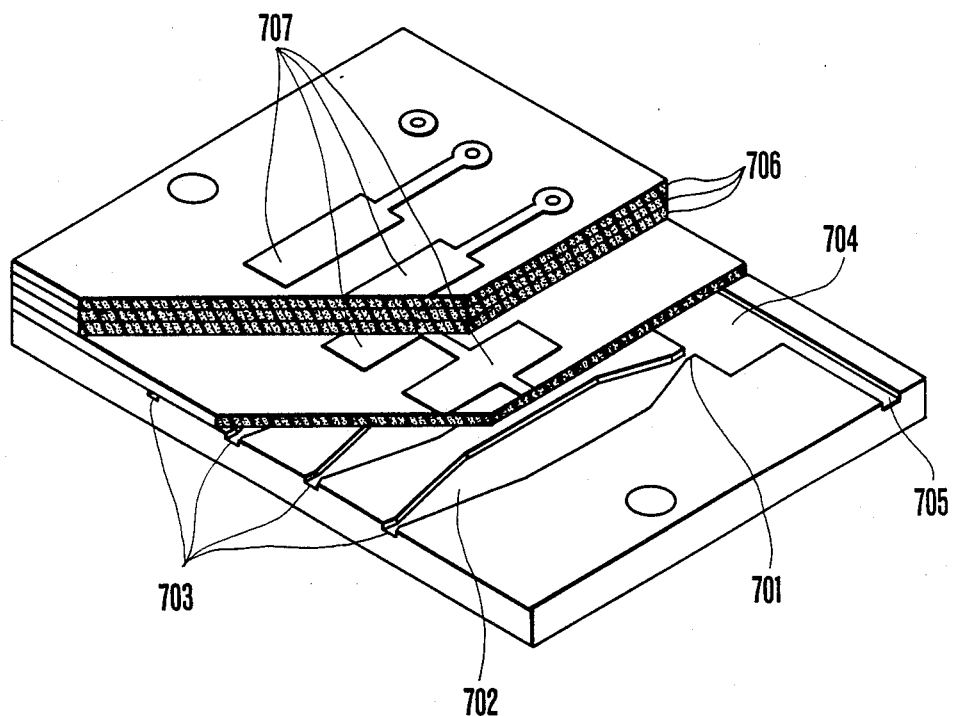
FIG. 19 is a partially cutaway perspective view showing still another embodiment of a ceramic electronic device according to the present invention.

FIG. 19 is a perspective view showing still another embodiment of a ceramic ink-jet head according to the present invention. An ink is supplied to a connecting port 705 from an ink fountain through an ink pipe. The ink is sprayed outside from each nozzle 703 through a common ink chamber 704, a corresponding ink supply port 701, and a corresponding pressure chamber 702. In this embodiment, the ink passage from the common ink chamber 704 to the respective nozzles 703 is constituted by four parallel channels to constitute a 4-nozzle head. The number of nozzles is arbitrarily determined to satisfy a desired recording speed. In this ink-jet head, the members excluding the electrodes are made of a ceramic material having electromechanical transducer characteristics. FIG. 19 shows that the head has a laminated structure of thin ceramic plates. In this case, different types of ceramic materials having different electromechanical transducer characteristics may be used to constitute a head. If a single ceramic material is used to constitute a head excluding the electrodes made of a metal material, the boundary between the ceramic layers cannot be identified since these layers are integrally formed. Referring to FIG. 19, The upper wall of each pressure chamber 702 comprises a plurality of ceramic layers 706 (four layers in this case). The number of layers is not limited to four, but may be arbitrarily determined according to the thickness of each layer and the electrode area. Electrodes are formed on the upper surface of each ceramic layer 706. The electrodes of each layer comprise driving electrodes 707 and wiring electrodes for connecting the driving electrodes to a drive circuit (not shown). The patterns of the driving electrodes 707 on the surfaces of the ceramic layers 706 are identical and vertically stacked. However, the pattern of the wiring electrodes of the odd-numbered layer in FIG. 20(a) is different from that of the even-numbered layer in FIG. 20(b). More specifically, the electrode patterns of the first and third layers counted from the side near the corresponding pressure chamber are arranged such that the driving electrodes 707 are commonly connected to a wiring electrode 709 through wiring electrodes 709, and the wiring electrode 709 is connected to the drive circuit, as shown in FIG. 20(a). The electrode patterns of the second and fourth layers are arranged such that the driving electrodes 707 are respectively connected to wiring electrodes 710 which are then connected to the drive circuit, as shown in FIG. 20(b). The electrode patterns in FIGS. 20(a) and 20(b) are alternately stacked in the vertical direction, as shown in FIG. 21. The corresponding electrodes 710 of the odd-numbered layers are connected to each other at terminals 712, and the corresponding electrodes 709 of the even-numbered layers are connected to each other at a terminal 711. The connections of the electrodes are performed along the stacking direction as follows. Through holes 713 are formed at the centers of the terminals 711 and 712 so as to extend through the ceramic layers. Before or after the laminated body of the ceramic layers is sintered, a conductive paste is filled in the through holes to achieve electrical connections.

In order to cause the electrode stacking portion as a laminated actuator, the ceramic layers between the electrodes must be polarized in advance. This polarization is performed in the same manner as in the conventional laminated actuator. In this embodiment, a predetermined high voltage is applied between the electrode terminals 711 and 712 for a short period of time. As a result, the ceramic portion sandwiched between the driving electrodes 707 is polarized along a direction perpendicular to the surface of the electrode. The polarization directions of each adjacent electrodes are opposite.

A method of manufacturing an ink-jet head of this embodiment will be described with reference to FIGS. 22(a) to 22(e).

FIGS. 22(a) to 22(e) show a method of manufacturing the ink-jet head, explaining steps from the cavity pattern formation for the ink channel pattern to sintering of the laminated body. The cavity pattern is formed as follows. As shown in FIG. 22(a), a photosensitive resin 715 is uniformly applied to a carrier film 714 such as a polyester film to form a resin layer having a predetermined thickness. A photomask 717 having the same pattern as the ink channel pattern is brought into contact with a photosensitive resin sheet 716, and the sheet 716 is then exposed with light. As shown in FIG. 22(b), the exposed sheet is developed to obtain a predetermined cavity pattern 718.

In the lamination step of FIG. 22(c), the ceramic green sheets are stacked such that the cavity pattern 718 is sandwiched therebetween. The ceramic green sheet is prepared as follows. A ceramic powder, an organic binder, a plastisizer, and the like are mixed and dispersed in a solvent according to a known method to prepare a slurry. The slurry is applied to a substrate such as a plastic film, a glass plate, or a metal sheet by a known coating method such as a doctor blade method and casting to form a slurry layer having a predetermined thickness. The slurry layer is then dried, and the dried layer is peeled from the substrate to obtain a ceramic green sheet. Thereafter, the ceramic green sheet is cut or punched to obtain a predetermined shape. Furthermore, if needed, through holes are formed in the green sheet by punching; and a conductive paste is screen-printed to form a surface electrode pattern. In this embodiment, as shown in FIGS. 20(a) and 20(b), two green sheets 720a having an identical electrode pattern 719a and two green sheets 720b having an identical electrode pattern 719b are alternately stacked, i.e., serve as the second and fourth layers and the first and third layers. Through holes 713 are formed at centers of electrode terminals 711 and 712 in the green sheets having the surface electrode patterns, as shown in FIG. 21.

Referring to FIG. 22(c), green sheets 721 do not have surface electrode patterns or through holes, but have the same outer dimensions as those of the green sheets 720a and 720b. These green sheets 720a, 720b, and 721 are stacked together with the cavity pattern 718 peeled from the carrier film in a press mold according to a predetermined order. The stacked sheets are pressed to obtain a laminated body 722, as shown in FIG. 22(d). In the pressing step, heat may be applied under pressure. The green sheets are partially deformed to completely surround the cavity pattern, thereby obtaining a laminated body 722.

The resultant laminated body 722 is cut into pieces of a predetermined shape and is subjected to removing of binder. The laminated body is slowly heated in the oxygen atmosphere to decompose and remove the resin constituting the cavity pattern and the organic material contained in the ceramic green sheets. The organic material is normally completely decomposed and oxidized at a temperature of 500° C. to 600° C. However, an abrupt temperature rise causes the damage to the laminated body. For this reason, the rate of temperature rise is 25° C./hour or less, and the temperature is kept at 500° C. to 600° C. for a long period of time to completely remove the organic material. As a result, the cavity pattern 718 in the laminated body 722 is removed, and thus cavities are left to constitute ink channels.

When the binder is removed from the laminated body 722, it is then sintered at a predetermined temperature to obtain a sintered body 723 as shown in FIG. 22(e). Thereafter, the sintered body is cut into pieces of a predetermined size, and the nozzle end face is polished to prepare an ink-jet head.

A $PbTiO_3$-$PbZrO_3$ based piezoelectric material was used as a ceramic powder constituting the green sheet. A conductive paste having an Ag/Pd ratio of 70/30 (weight ratio) was used as the electrode material. A UV curable acrylic resin was used as a photosensitive resin for forming the cavity pattern. After the resin was exposed with ultraviolet rays, it was developed by methyl ethyl ketone.

The ceramic green sheets and the cavity pattern were pressed at a pressure of 250 kg/cm² and at a temperature of 110° C. for 30 minutes.

The binder was removed such that the laminated body was heated in air at a temperature rise rate of 5° C./hour. After the laminated body was heated to 500° C. and kept thereat for 3 hours. Sintering was performed at 1,150° C. for 2 hours.

The thickness of each green sheet and the photosensitive resin pattern was about 100 μm. After sintering, the sectional size of the nozzle is about 80 μm×80 μm. The height of the channel inside the sintered body was about 80 μm. An experimental head of FIG. 19 was prepared under the above conditions, and stable ink ejection can be achieved. The pulse voltage amplitude was controlled such that the volumes of the ink drops and ejection speeds thereof became identical. Variations in voltage fell within the range of 34 V to 37 V. Therefore, it was found that the uniform ejection characteristics of the nozzles could be obtained.

As a comparison, a two-layer ink-jet head (i.e., the number of layers is reduced to ½ as compared with the head of FIG. 19) was experimentally prepared. In this case, in order to perform stable ink ejection of the respective nozzles, an application voltage greatly varied from 55 V to 70 V.

The method of the present invention provides a ceramic ink-jet head incorporating a laminated actuator having a large number of electromechanical transducer elements along the direction of thickness. As compared with the case wherein a laminated actuator is built into as an individual component, the positional precision of the laminated actuator can be improved to provide an ink-jet head having good and uniform ejection characteristics. Furthermore, the fabrication techniques do not require skills, and the head can be easily manufactured in a mass production line. The device cost can be greatly reduced. The use of the laminated actuator greatly reduces the drive voltage, and a simple drive circuit can be used with high reliability, thereby further reducing the cost.

What is claimed is:

1. A method of manufacturing a ceramic electronic device comprising steps of:
   forming a material into a pattern of a predetermined shape, said material decomposing when it is heated to a temperature which is not higher than a sintering temperature of a ceramic material;
   forming an electrical circuit element in a ceramic green sheet of said ceramic material;
   stacking said pattern, said ceramic green sheet having said electrical circuit element, and at least another ceramic green sheet to obtain a laminated body; and
   sintering said laminated body to obtain a sintering body from which said material formed into said pattern has been removed by a decomposition thereof.

2. A method according to claim 1, further including the steps of removing a binder so as to decompose and remove an organic material contained in said laminated body, and cutting said sintered body into pieces of a predetermined shape.

3. A method according to claim 1, wherein the step of forming said material into a predetermined pattern includes the step of forming a photosensitive resin layer on a carrier film, bringing a predetermined photomask into contact with said photosensitive resin layer, exposing said photosensitive resin layer with light, and peeling said pattern from said carrier film.

4. A method according to claim 1, wherein the step of forming said electrical circuit element in said green sheet includes the step of forming a through hole by punching and by printing conductive, resistive and dielectric pastes on said green sheet so as to form an electrode, a resistor, and a capacitor thereon.

5. A method according to claim 1, wherein the step of forming said laminated body includes steps of cutting said material forming said pattern, said ceramic green sheet having said electrical circuit element, and said at least another ceramic green sheet into pieces of a predetermined size which stack in a mold, and stacking and then pressing said pattern, said ceramic green sheet, and said at least another ceramic green sheet in said mold, all of which have the predetermined size.

6. A method according to claim 5, wherein heat is applied to said mold under pressure.

7. A method of manufacturing a ceramic electronic device, comprising steps of: forming a pattern of a predetermined shape made of a photosensitive resin; filling a ceramic paste in a portion excluding said pattern to form a ceramic green sheet incorporating said pattern; forming an electrical circuit element on another green sheet; stacking and pressing said ceramic green sheet incorporating said pattern, said another ceramic green sheet having said electrical circuit element, and at least still another ceramic sheet to form form a laminated body; removing a binder so as to decompose and remove an organic material contained in said laminated body; sintering said laminated body after removing of the binder is performed to obtain a sintered body in which is formed a cavity having a shape identical to said pattern; and cutting said sintering body including said cavity into pieces of a predetermined size.

8. A method of manufacturing an ink jet head comprising steps of:
   forming a material into a pattern having a shape which is identical to a shape of an ink passage of said ink jet head, said material decomposing when it is heated to a temperature which is not higher than a sintering temperature of a ceramic material;
   forming a plurality of ceramic green sheets made of said ceramic material, at least one of said plurality of ceramic green sheets being formed with an electrical circuit element therein;
   stacking said material formed into said pattern and said plurality of ceramic green sheets to obtain a laminated body;
   sintering said laminated body to obtain a sintered body from which said material formed into said pattern has been removed by a decomposition thereof; and
   cutting said sintered body to obtain said ink jet head.

9. The method according to claim 8, wherein said ink passage includes a nozzle aperture, an ink channel, a pressure chamber, and an ink supply portion of said ink jet head.

* * * * *